United States Patent
Feng et al.

(10) Patent No.: US 11,923,483 B2
(45) Date of Patent: Mar. 5, 2024

(54) METHOD FOR PRODUCING LED BY ONE STEP FILM LAMINATION

(71) Applicants: Rohm and Haas Electronic Materials LLC, Marlborough, MA (US); DDP Specialty Electronic Materials US 9, LLC, Wilmington, DE (US)

(72) Inventors: Anna Ya Ching Feng, Zhubei (TW); Lu Zhou, Pudong District (CN)

(73) Assignees: DDP SPECIALTY ELECTRONIC MATERIALS US, LLC, Wilmington, DE (US); ROHM AND HAAS ELECTRONC MATERIALS LLC, Wilmington, DE (US)

( * ) Notice: Subject to any disclaimer, the term of this patent is extended or adjusted under 35 U.S.C. 154(b) by 106 days.

(21) Appl. No.: 17/055,340

(22) PCT Filed: May 18, 2018

(86) PCT No.: PCT/CN2018/087460
§ 371 (c)(1),
(2) Date: Nov. 13, 2020

(87) PCT Pub. No.: WO2019/218336
PCT Pub. Date: Nov. 21, 2019

(65) Prior Publication Data
US 2021/0226100 A1   Jul. 22, 2021

(51) Int. Cl.
*H01L 33/50* (2010.01)

(52) U.S. Cl.
CPC .... *H01L 33/504* (2013.01); *H01L 2933/0041* (2013.01)

(58) Field of Classification Search
CPC ................ H01L 33/501; H01L 33/504; H01L 21/02112; H01L 21/02109; H01L 21/022; H01L 2933/0041
See application file for complete search history.

(56) References Cited

U.S. PATENT DOCUMENTS

| | | | |
|---|---|---|---|
| 7,943,947 B2 | 5/2011 | Do | |
| 2010/0129589 A1 | 5/2010 | Senibi | |
| 2011/0002140 A1 | 1/2011 | Tsukahara et al. | |
| 2013/0168717 A1* | 7/2013 | Kono | H01L 33/505 438/27 |
| 2013/0221835 A1 | 8/2013 | Basin et al. | |

(Continued)

FOREIGN PATENT DOCUMENTS

| | | |
|---|---|---|
| CN | 104357909 A | 2/2015 |
| CN | 106486505 A | 3/2017 |

(Continued)

OTHER PUBLICATIONS

European Search Report for corresponding European Patent Application No. EP18918870 dated Dec. 3, 2021.

(Continued)

*Primary Examiner* — Sarah K Salerno

(57) ABSTRACT

The present invention relates to method for producing LED by one step film lamination. The method comprises: laminating two or more LEDs with two or more colored phosphor films by one step film lamination; wherein each of the colored phosphor film comprises each other different colored phosphor composition which has a Maximum tan δ; and the difference of each Maximum tan δ varies within a range of 0-30%. In the present invention, the method for producing a LED may greatly improve production efficiency (i.e., dual and multi-color LEDs in one step) and lower cost of ownership. Further, it may improve uniformity of phosphor dispersion, thereby improve color quality of LEDs.

8 Claims, 2 Drawing Sheets

(56) References Cited

U.S. PATENT DOCUMENTS

| | | | |
|---|---|---|---|
| 2015/0329770 A1 | 11/2015 | Kaneyoshi et al. | |
| 2016/0230084 A1 | 8/2016 | Liu et al. | |
| 2018/0053881 A1* | 2/2018 | Murphy | H01L 33/56 |
| 2018/0057714 A1 | 3/2018 | Teng et al. | |
| 2019/0055361 A1* | 2/2019 | Roitman | C09K 11/0883 |

FOREIGN PATENT DOCUMENTS

| | | |
|---|---|---|
| JP | 2014-116587 A | 6/2014 |
| JP | 2015-046607 A | 3/2015 |
| JP | 2015-130459 A | 7/2015 |
| KR | 10-2014-0024932 A | 3/2014 |
| WO | 2015/060289 A | 4/2015 |

OTHER PUBLICATIONS

English translation of Notice of Preliminary Rejection for corresponding Korean Application No. 10-2020-7032854 dated Jan. 21, 2022.
Search report for corresponding International Application No. PCT/CN2018087460 dated Jan. 30, 2019.
English translation of Decision of Dismissal of Amendment for corresponding Japanese Patent Application No. 2020-563919 dated Apr. 10, 2023.
English translation of Notice on the First Office Action for corresponding Chinese Patent Application No. 201880093367.9 dated Sep. 22, 2023.

* cited by examiner

METHOD FOR PRODUCING LED BY ONE STEP FILM LAMINATION

TECHNICAL FIELD

The present invention relates to a method for producing LED, particularly to a method for producing dual color LED and/or multi-colored LED by one step film lamination.

TECHNICAL BACKGROUND

Dual color LED (or multi-colored LED) is now more and more popular in smart phones like iPhones as Flash and outdoor lighting. In terms of application in Flash, there are generally two LEDs with different color (e.g., amber and white). By adjusting their ratio, the camera can adjust color of the flash to match what been determined to be the white balance of ambient light. Flash LED is an import application of colored phosphor films. Outdoor LED strip lamps with dual or more color are also more and more popular in the market.

However, current methods for producing dual color LED generally comprise two steps: (1) making two different color LEDs separately, and (2) then assembling two different color LEDs together (see, FIG. 1, referred as old method 1). Another current method for producing dual color LED also comprises two steps: (1) adding a baffle between two LEDs, and (2) then dispensing two different silicone solutions with phosphor (see, FIG. 1, referred as old method 2). Currently, above two old methods are suffered with some deficiencies, such as low production efficiency (which requires two steps), low color quality (since phosphor particles tends to be settled in silicone solutions).

Accordingly, there is a need to provide a novel method for producing LED such as dual color LED and multi-colored LED, which can produce high color quality dual color LEDs with high production efficiency.

SUMMARY

An objective of an exemplary embodiment of the present invention is to overcome the above and/or other deficiencies in the prior art. The inventors unexpectedly find that by controlling rheology performance (e.g., maximum tan δ, minimum G' and curing time) of the colored phosphor compositions, two or more LEDs may be laminated with two or more colored phosphor films by one step film lamination, such that it may produce high color quality dual color LEDs with high production efficiency.

In the present invention, by adjusting a ratio of a cure catalyst and silicone binder, or using a hydrosilylation curable organosiloxane composition, two or more colored phosphor compositions may have close rheology performance (e.g., maximum tan δ and gelling time).

Thus, an exemplary embodiment of the present invention provides a method for producing LED, comprising: laminating two or more LEDs with two or more colored phosphor films by one step film lamination; wherein each of the colored phosphor film comprises each other different colored phosphor composition which has a Maximum tan δ; and the difference of each Maximum tan S varies within a range of 0-30%.

In one embodiment of the present invention, each of the different colored phosphor composition has a gelling time, and the difference of each gelling time varies within a range of 0-50%.

In one embodiment of the present invention, the difference of each Maximum tan S varies within a range of 0-15%.

In one embodiment of the present invention, the colored phosphor composition comprises a cure catalyst, a silicone binder and a phosphor; and the difference of gelling time and Maximum tan S is controlled by adjusting a ratio of the catalyst and silicone binder, and/or a ratio of the silicone binder and phosphor.

In one embodiment of the present invention, the phosphor is pre-treated with a treatment agent, particularly when red or green phosphor is involved in phosphor film. In some embodiments, the treatment agent is identical to the cure catalyst as used. The pre-treatment method comprises: (1) contacting the phosphor with treatment agent for a period time so as to ensure a good dispersion of phosphor in the treatment agent; and (2) drying the phosphor coated with the treatment agent, which is ready to be used with the silicone binder.

In one embodiment of the present invention, the colored phosphor composition comprises a hydrosilylation curable organosiloxane composition and a phosphor.

Other features and aspects will become apparent from the following Detailed Description, the Drawings and the Claims.

BRIEF DESCRIPTION OF THE DRAWINGS

The present invention can be understood better in light of the description of exemplary embodiments of the present invention with reference to the accompanying drawings, in which.

DETAILED DESCRIPTION

Figure 1:
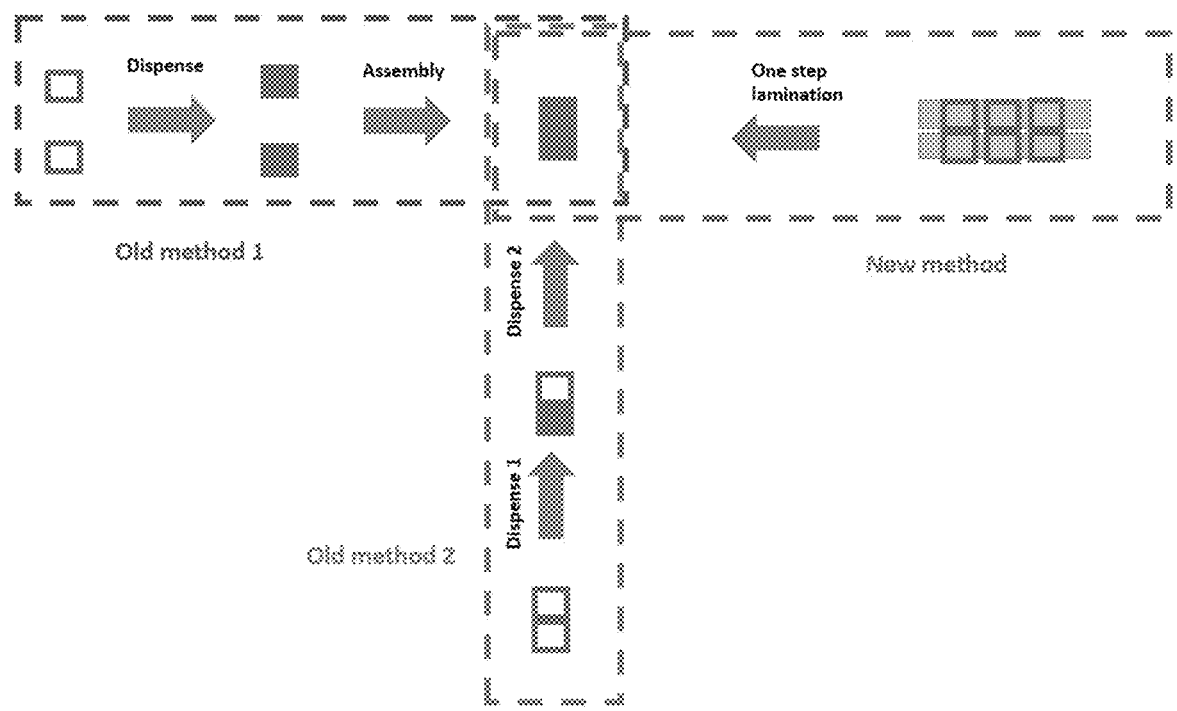
FIG. 1 is a schematic diagram showing current methods for producing dual color LED (old methods 1 and 2) and an inventive method for producing LED (e.g., dual color LED).

Hereafter, a detailed description will be given for preferred embodiments of the present disclosure. It should be pointed out that in the detailed description of the embodiments, for simplicity and conciseness, it is impossible for the Description to describe all the features of the practical embodiments in details. It should be understood that in the process of a practical implementation of any embodiment, just as in the process of an engineering project or a designing project, in order to achieve a specific goal of the developer and in order to satisfy some system-related or business-related constraints, a variety of decisions will usually be made, which will also be varied from one embodiment to another. In addition, it can also be understood that although the effort made in such developing process may be complex and time-consuming, some variations such as design, manufacture and production on the basis of the technical contents disclosed in the disclosure are just customary technical means in the art for those of ordinary skilled in the art associated with the contents disclosed in the present disclosure, which should not be regarded as insufficient disclosure of the present disclosure.

Unless defined otherwise, all the technical or scientific terms used in the Claims and the Description should have the same meanings as commonly understood by one of ordinary skilled in the art to which the present disclosure belongs. The terms "a", "an" and the like do not denote a limitation of quantity, but denote the existence of at least one. The terms "comprises", "comprising", "includes", "including" and the like mean that the element or object in front of the "comprises", "comprising", "includes" and "including" covers the elements or objects and their equivalents illustrated following the "comprises", "comprising", "includes" and "including", but do not exclude other elements or objects. Generally, as used herein a hyphen "-" or dash "-" in a range of values is "to" or "through."

In the present invention, the inventors find that by controlling rheology performance (e.g., maximum tan δ and gelling time) of the colored phosphor compositions, two or more LEDs may be laminated with two or more colored phosphor films by one step film lamination. In one embodiment, two or more colored phosphor compositions may have close rheology performance (e.g., maximum tan δ and gelling time) by adjusting a ratio of a cure catalyst and silicone binder, and/or a ratio of the silicone binder and phosphor. In another embodiment, two or more colored phosphor compositions may have close rheology performance (e.g., maximum tan δ and gelling time) by using a hydrosilylation curable organosiloxane composition.

In one embodiment of the present invention, the method for producing LED comprises: laminating two or more LEDs with two or more colored phosphor films by one step film lamination; wherein each of the colored phosphor film comprises each other different colored phosphor composition which has a Maximum tan δ; the difference of each Maximum tan δ varies within a range of 0-30%.

In one embodiment of the present invention, the difference of each Maximum tan δ varies within a range of 0-30%, 0-20%, 0-15%, 0-10%, 10-30%, 10-20%, 10-15%, 15-30%, 15-20%, or 20-30%.

The term, "the difference of each Maximum tan δ", as used herein, is represented by the following:

$$\text{the difference of each Maximum tan}\,\delta = \frac{(\text{larger Maximum tan}\,\delta - \text{smaller Maximum tan}\,\delta)}{\text{smaller Maximum tan}\,\delta} \times 100\%$$

In one embodiment of the present invention, each of the colored phosphor films comprises each other different colored phosphor composition which may have a gelling time; the difference of each gelling time varies within a range of 0-50%.

In one embodiment of the present invention, the difference of each gelling time varies within a range of 0-50%, 040%, 0-35%, 0-30%, 0-20%, 0-10%, 10-50%, 10-40%, 10-35%, 10-30%, 10-20%, 20-50%, 20-40%, 20-35%, 20-30%, 30-50%, 30-40%, 30-35%, 35-50%, 35-40%, or 40-50%.

The term, "the difference of each gelling time", as used herein, is represented by the following:

$$\text{the difference of each gelling time} = \frac{(\text{larger gelling time} - \text{smaller gelling time})}{\text{smaller gelling time}} \times 100\%$$

The term, "Maximum tan δ (or Max. tan δ)", as used herein, refers to maximum tan δ=loss modulus/storage modulus, which is used to characterize the silicone binder system's flowability capability at heating temperature. The term, "gelling time", as used herein is defined by time from Max. tan δ to tan δ=1, which is used to characterize how fast the silicone binder system cures. Said gelling time and Max. tan δ are most two important rheology performance for success phosphor one-step film lamination.

Figure 2:
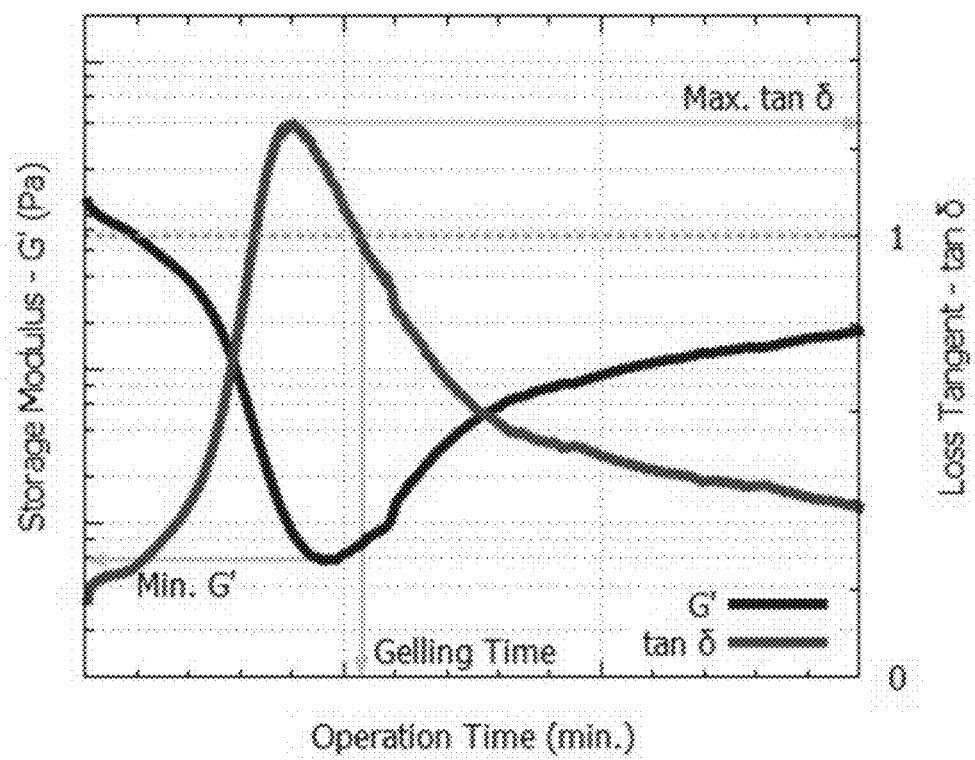
FIG. 2 is a diagram showing rheology profile of uncured silicone binder system in present invention.

In general, uncured silicone binder system will flow first with temperature increase and then get cured. FIG. 2 shows rheology profile of the uncured silicone binder system. In the present invention, said rheology profile is measured by rotational rheometer with the following conditions. (1) 25-150° C. by 25° C./min.; (2) 150° C. for 30 min.; and (3) 0.1% distortion, 1.0 Hz frequency, and by using 8 mm steel plate.

Since the curing performance of silicone binder system would be affected by various phosphor. For one step film lamination, two or more different colored phosphor composition should be tuned to provide close rheology performance (e.g., gelling time and maximum tan δ). In one embodiment of the present invention, the difference of each gelling time varies within a range of 0-50%, 0-40%, 0-35%, 0-30%, 0-20%, 0-10%, 10-50%, 10-40%, 10-35%, 10-30%, 10-20%, 20-50%, 20-40%, 20-35%, 20-30%, 30-50%, 30-40%, 30-35%, 35-50%, 35-40%, or 40-50%; and/or the difference of each Maximum tan δ varies within a range of 0-30%, 0-20%, 0-15%, 0-10%, 10-30%, 10-20%, 10-15%, 15-30%, 15-20%, or 20-30%. On the other hand, the more catalyst, the colored phosphor composition would cure fast. Thus, the present inventors unexpected find that the difference of gelling time and Maximum tan δ may be controlled by adjusting a ratio of the catalyst and silicone binder, and/or a ratio of the silicone binder and phosphor, so as to provide close rheology performance.

In one embodiment of the present invention, the colored phosphor composition comprises a cure catalyst, a silicone binder and a phosphor; and the difference of gelling time and Maximum tan δ is controlled by adjusting a ratio of the catalyst and silicone binder, and/or a ratio of the silicone binder and phosphor. In most embodiments, phosphors are add together with a silicone bonder and catalyst, and solvent such as toluene is add to adjust viscosity of the composition to around 2000-8000 mPa·s for easy film coating. After mixing, the slurry phosphor composition is coated on PET release liner by auto applicator. The wet phosphor film are then dry at room temperature for 5 min and then put in oven at a temperature of about 70° C. for 30 min. The dried phosphor films are generally around 50-150 μm.

In the present invention, the cure catalyst may be selected from any catalyst known in the art to effect condensation cure of organosiloxanes, such as various tin or titanium catalysts. Curing catalyst can be any curing catalyst that may be used to promote condensation of silicon bonded hydroxy (=silanol) groups to form Si—O—Si linkages. Examples include, but are not limited to, amines and complexes of lead, tin, titanium, zinc, and iron. Other examples include, but are not limited to basic compounds, such as trimethylbenzylammonium hydroxide, tetramethylammonium hydroxide, n-hexylamine, tributylamine, diazabicycloundecene (DBU) and dicyandiamide; and metal-containing compounds such as tetraisopropyl titanate, tetrabutyl titanate, titanium acetylacetonate, aluminum triisobutoxide, aluminum triisopropoxide, zirconium tetra(acetylacetonato), zirconium tetrabutylate, cobalt octylate, cobalt acetylacetonato, iron acetylacetonato, tin acetylacetonato, dibutyltin octylate, dibutyltin laurate, zinc octylate, zinc bezoate, zinc p-tert-butylbenzoate, zinc laurate, zinc stearate, aluminium phosphate, and alminium triisopropoxide; organic titanium chelates such as aluminium trisacetylacetonate, aluminium bisethylacetoacetate monoacetylacetonate, diisopropoxybis(ethylacetoacetate)titanium, and diisopropoxybis(ethylacetoacetate)titanium. In some embodiments, the curing catalysts include zinc octylate, zinc bezoate, zinc p-tert-butylbenzoate, zinc laurate, zinc stearate, aluminium phosphate, and aluminum triisopropoxide. See, e.g., U.S. Pat. No. 8,193,269, the entire disclosure of which is incorporated by reference as if fully set forth herein. Other examples of curing catalysts include, but are not limited to aluminum alkoxides, antimony alkoxides, barium alkoxides, boron alkoxides, calcium alkoxides, cerium alkoxides, erbium alkoxides, gallium alkoxides, silicon alkoxides, germanium alkoxides, hafnium alkoxides, indium alkoxides, iron alkoxides, lanthanum alkoxides, magnesium alkoxides, neodymium alkoxides, samarium alkoxides, strontium alkoxides, tantalum alkoxides, titanium alkoxides, tin alkoxides, vanadium alkoxide oxides, yttrium alkoxides, zinc alkoxides, zirconium alkoxides, titanium or zirconium compounds, especially titanium and zirconium alkoxides, and chelates and oligo- and polycondensates of the above alkoxides, dialkyltin diacetate, tin(II) octoate, dialkyltin diacylate, dialkyltin oxide and double metal alkoxides. Double metal alkoxides are alkoxides containing two different metals in a particular ratio. In some embodiments, the curing catalysts include titanium tetraethylate, titanium tetrapropylate, titanium tetraisopropylate, titanium tetrabutylate, titanium tetraisooctylate, titanium isopropylate tristearoylate, titanium truisopropylate stearoylate, titanium diisopropylate distearoylate, zirconium tetrapropylate, zirconium tetraisopropylate, zirconium tetrabutylate. See, e.g., U.S. Pat. No. 7,005,460, the entire disclosure of which is incorporated by reference as if fully set forth herein. In addition, the curing catalysts include titanates, zirconates and hafnates as described in DE 4427528 C2 and EP 0 639 622 B1, both of which are incorporated by reference as if fully set forth herein. In some embodiments, the curing catalyst comprises Dow Corning® LF-9000 Film Encapsulant Catalyst (commercially available from DOW CORNING CORPORATION).

In the present invention, treatment agent is used when handling specific phosphors like red one and etc. Treatment agent is similar with catalyst in effective composition while it is around 2-10 times higher concentration.

In the present invention, the silicone binder may be selected from any silicone binder known in the art to form organosiloxane copolymer. In some embodiments, the silicone binder may be solved in an organic solvent. Also, the silicone binder may be those as described in WO 2013/134018, which is incorporated by reference as if fully set forth herein. In some embodiments, the silicone binder comprises Dow Corning® LF-1020 (commercially available from DOW CORNING CORPORATION).

In the present invention, the phosphor may be selected from any phosphor known in the art. Examples thereof include, but are not limited to, YAG-04 phosphor (commercially available from Intematix Corporation), NYAG4454-L phosphor (commercially available from Intematix Corporation), BR-102L Phosphor (commercially available from Mitsubishi Chemical Corporation), GAL 550 Phosphor (commercially available from Intematix Corporation) or any combinations thereof.

In one embodiment of the present invention, the phosphor may be pre-treated with a treatment agent, particularly when red or green phosphor is involved in phosphor film. In some embodiments, the treatment agent is preferably a basic compounds, such as trimethylbenzylammonium hydroxide, tetramethylammonium hydroxide, n-hexylamine, tributylamine, diazabicycloundecene (DBU) and dicyandiamide. The pre-treatment method comprises: (1) contacting the phosphor with treatment agent for a period time so as to ensure a good dispersion of phosphor in the treatment agent; and (2) drying the phosphor coated with the treatment agent, which is ready to be used with the silicone binder. Phosphor pre-treatment is one way to lower down the impact of phosphor on silicone binder cure performance.

For example, the pre-treatment method comprises:

Weighing a phosphor and a treating agent in a ratio of 1:1;

Charging the phosphor and a treating agent in a closed sealed container;

mixing and soaking the phosphor in the treating agent for 4 hours, so as to ensure a good dispersion of phosphor in the treatment agent solution;

Filtering out the phosphor or using other method to separate phosphor from the treating agent, and Putting the wet phosphor into a drying oven and heating up to 150° C. for 8 hours, so as to provide dried phosphor which is ready to be used for formulations.

In one embodiment of the present invention, the colored phosphor composition comprises a hydrosilylation curable organosiloxane composition and a phosphor. The hydrosilylation curable organosiloxane composition may comprise a hydrosilylation catalyst. In some embodiments, the hydrosilylation curable organosiloxane composition comprises Dow Corning® LF-1112 Phosphor Film Binder A&B Kit (commercially available from DOW CORNING CORPORATION). Also, the hydrosilylation curable organosiloxane composition may be those as described in WO 2016/022332A1, which is incorporated by reference as if fully set forth herein.

In the present invention, the method for producing a LED may greatly improve production efficiency (i.e., dual and multi-color LEDs in one step) and lower cost of ownership. Further, it may improve uniformity of phosphor dispersion, thereby improve color quality of LEDs.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

Reference Example 1: Preparation of YAG-04 Phosphor Film

The materials as used in Reference Example 1 are as follows:

Silicone binder 1: Dow Corning® LF-1020 Phosphor Film Binder, 5 g, commercially available from DOW CORNING CORPORATION;

Catalyst 1: Dow Corning® LF-9000 Film Encapsulant Catalyst, 0.075 g, commercially available from DOW CORNING CORPORATION; and Phosphor 1: YAG-04 phosphor, 5 g, commercially available from Intematix Corporation.

In Reference Example 1, the ratios of Silicone binder 1 to Catalyst 1 are 100:1, 100:1.5 and 100:2, respectively. And the ratio of Silicone binder 1 to Phosphor 1 is 100:100.

Sample preparation (taking a ratio of Silicone binder 1 to Catalyst 1=100:1.5 as example)
  (1) providing 5 g Phosphor 1 with 5 g Silicone binder 1 and 0.075 g Catalyst 1, with adding 0.3 g toluene as organic solvent to adjust the viscosity, and mixing in a ThinkyARV-310 planetary vacuum mixer to provide a mixed slurry;
  (2) using Hobsen auto applicator, coating the mixed slurry on a PET release liner;
  (3) drying the PET release liner at room temperature for 5 min. and then put it into a drying oven at a temperature of 70° C. for 30 min., resulting in a dry film with a thickness of 75 μm.

Test Procedure

The rheology performance is measured by TA ARES G2 rheometer using following conditions: (1) 15-150° C. by 25° C./min.; (2) 150° C. for 30 min.; and (3) 0.5% strain, 1.0 Hz frequency, and by using 8 mm steel plate.

| Silicone Binder 1:Catalyst 1 | Gelling time (sec.) | Max. tan δ |
|---|---|---|
| 100:1 | 1224 | 2.21 |
| 100:1.5 | 510 | 1.79 |
| 100:2 | 315 | 1.25 |

Reference Example 2: Preparation of NYAG4454-L Phosphor Film

The materials as used in Reference Example 2 are as follows:

Silicone binder 1: Dow Corning® LF-1020 Phosphor Film Binder, 5 g, commercially available from DOW CORNING CORPORATION;

Catalyst 1: Dow Corning LF-9000 Film Encapsulant Catalyst, 0.1 g, commercially available from DOW CORNING CORPORATION; and Phosphor 2: NYAG4454-L phosphor, 5 g, commercially available from Intematix Corporation.

In Reference Example 2, the ratios of Silicone binder 1 to Catalyst 1 are 100:2, 100:2.5 and 100:3, respectively. And the ratio of Silicone binder 1 to Phosphor 2 is 100:100.

Sample preparation (taking a ratio of Silicone binder 1 to Catalyst 1=100:2 as example)
  (1) providing 5 g Phosphor 2 with 5 g Silicone binder 1 and 0.1 g Catalyst 1, with adding 0.3 g toluene as organic solvent to adjust the viscosity, and mixing in a ThinkyARV-310 planetary vacuum mixer to provide a mixed slurry;
  (2) using Hohsen auto applicator, coating the mixed slurry on a PET release liner;
  (3) drying the PET release liner at room temperature for 5 min. and then put it into a drying oven at a temperature of 70° C. for 30 min., resulting in a dry film with a thickness of 75 μm.

Test Procedure

The rheology performance is measured by TA ARES G2 rheometer using following conditions: (1) 15-150° C. by 25° C./min.; (2) 150° C. for 30 min.; and (3) 0.5% strain, 1.0 Hz frequency, and by using 8 mm steel plate.

| Silicone Binder 1:Catalyst 1 | Gelling time (sec.) | Max. tan δ |
|---|---|---|
| 100:2 | 515 | 1.84 |
| 100:2.5 | 356 | 1.49 |
| 100:3 | 309 | 1.34 |

Example 1: One Step Film Lamination

From above Reference Examples 1 and 2, it could be noted that for close rheology performance, the ratio of Silicone binder 1 to Catalyst 1 for NYAG4454-L phosphor should be decreased to 100:2 in comparison with said "100:1.5" for YAG-04 phosphor. The difference of the gelling time varies within 1%; and the difference of each Maximum tan δ varies within 2.8%.

The phosphor films as obtained in Reference Examples 1 and 2 are laminated by Fulin PLC-100A vacuum laminator. The lamination conditions are as follows:
  Lamination temperature: 124.6° C.;
  Lamination time: 300 seconds; and
  Vacuum: 0.34 kPa In this example, two different colored phosphor films are successfully laminated on LEDs in one step film lamination, which exhibits uniform phosphor dispersion and better color quality.

Example 2: Red Phosphor Pre-Treatment and Dual Color Phosphor Film Lamination 2.1 Cold White Phosphor Film 3C Formulation:

The materials as used are as follows:

Silicone binder 1: Dow Corning® LF-1020 Phosphor Film Binder, 5 g, commercially available from DOW CORNING CORPORATION;

Catalyst 1: Dow Corning® LF-9000 Film Encapsulant Catalyst, 0.075 g, commercially available from DOW CORNING CORPORATION; and Phosphor 1: YAG-04 Phosphor, commercially available from Intematix Corporation.

Phosphor 3: BR-102L Phosphor, commercially available from Mitsubishi Chemical Corporation.

In 3C formulation, the ratio of Silicone binder 1 to Catalyst 1 is 100:1.5. And the ratio of Silicone binder 1 to Phosphors 1 and 3 is 100:56. The ratio of Phosphor 1 to Phosphor 3 is 40:1. BR-102L is pretreated with treatment agent following below procedure.

Weighing the phosphor 3 and the treating agent in a ratio of 1:1.
  Charging them in an appropriate container and closely tight it.
  Using mixer to soak the phosphor in the treating agent for 4 hours and ensure a good dispersion of phosphor in the solution.
  Filtering out the phosphor to separate phosphor from the treating agent.
  Putting the wet phosphor into a drying oven and heating up to 150° C. for 8 hours.
  The dried phosphor is ready to be used for formulations.

Sample Preparation (1) providing 2.732 g Phosphor 1 and 0.068 g Phosphor 3 with 5 g Silicone binder 1 and 0.075 g Catalyst 1, with adding 0.3 g toluene as organic solvent to adjust the viscosity, and mixing in a ThinkyARV-310 planetary vacuum mixer to provide a mixed slurry;

(2) using Hohsen auto applicator, coating the mixed slurry on a PET release liner;

(3) drying the PET release liner at room temperature for 5 min. and then put it into a drying oven at a temperature of 70° C. for 30 min., resulting in a dry film with a thickness of 80 μm.

Test Procedure

The rheology performance is measured by TA ARES G2 rheometer using following conditions: (1) 15-150° C. by 25° C./min.; (2) 150° C. for 20 min.; and (3) 0.5% strain, 1.0 Hz frequency, and by using 8 mm steel plate.

2.2 Warm White Phosphor Film 3W Formulation:

The materials as used are as follows:

Silicone binder 1: Dow Corning® LF-1020 Phosphor Film Binder, 5 g, commercially available from DOW CORNING CORPORATION;

Catalyst 1: Dow Corning® LF-9000 Film Encapsulant Catalyst, 0.050 g, commercially available from DOW CORNING CORPORATION; and Phosphor 1: YAG-04 Phosphor, commercially available from Intematix Corporation.

Phosphor 3: BR-102L Phosphor, commercially available from Mitsubishi Chemical Corporation.

In 3W formulation, the ratio of Silicone binder 1 to Catalyst 1 is 100:1. And the ratio of Silicone bonder 1 to Phosphors 1 and 3 is 100:139. The ratio of Phosphor 1 to Phosphor 3 is 2:1. BR-102L is pretreated with treatment agent following above similar procedure.

Sample Preparation (1) providing 4.633 g Phosphor 1 and 2.317 g Phosphor 3 with 5 g Silicone binder 1 and 0.050 g Catalyst 1, with adding 0.5 g toluene as organic solvent to adjust the viscosity, and mixing in a ThinkyARV-310 planetary vacuum mixer to provide a mixed slurry;

(2) using Hohsen auto applicator, coating the mixed slurry on a PET release liner;

(3) drying the PET release liner at room temperature for 5 min. and then put it into a drying oven at a temperature of 70° C. for 30 min., resulting in a dry film with a thickness of 86 μm.

Test Procedure

The rheology performance is measured by TA ARES G2 rheometer using following conditions: (1) 15-150° C. by 25° C./min.; (2) 150° C. for 20 min.; and (3) 0.5% strain, 1.0 Hz frequency, and by using 8 mm steel plate.

2.3 Rheology Performance

Cold white and warm white phosphor films' rheology performances are listed in below table.

| Phosphor film | Gelling time (sec.) | Max. tan δ |
| --- | --- | --- |
| 3C | 526 | 1.36 |
| 3W | 360 | 1.48 |

2.4 Lamination.

Figure 3:
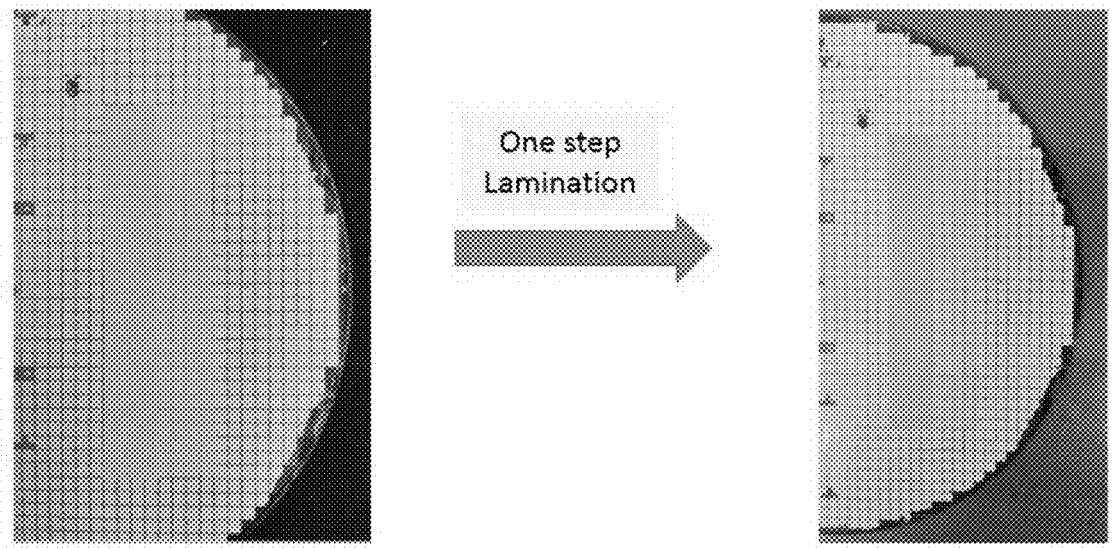
FIG. 3 is a schematic diagram showing an exemplary embodiment (Example 2) of the method for producing LED (e.g., dual color LED) in present invention.

Cold white and warm white phosphor films 3C and 3W are laminated by Fulin PLC-100A vacuum laminator. Detailed lamination condition:

Lamination temperature: 124.6° C.;
Lamination time: 300 seconds; and
Vacuum: 0.34 kPa As shown in FIG. 3, Cold white and warm white phosphor films 3C and 3W are successfully laminated on LEDs in one step film lamination, which exhibits uniform phosphor dispersion and better color quality.

Example 3: Hydrosilylation Cure Dual Color Phosphor Film Preparation and Lamination 3.1 Cold White Phosphor Film 4C Formulation:

The materials as used are as follows:

Silicone binder 4: Dow Corning® LF-1112 Phosphor Film Binder Part A+Part B (1:1), 5 g, commercially available from DOW CORNING CORPORATION;

Phosphor 1: YAG-04 Phosphor, commercially available from Intematix Corporation.

Phosphor 4: GAL550 Phosphor, commercially available from Intematix Corporation.

In 4C formulation, the ratio of Silicone binder 4 to Phosphors 1 and 4 is 100:27. The ratio of Phosphor 1 to Phosphor 4 is 5:1.

Sample Preparation (1) providing 1.125 g Phosphor 1 and 0.225 g Phosphor 4 with 2.5 g part A of Silicone binder 4 and 2.5 g part B of Silicone binder 4, with adding 0.3 g propyl propionate as organic solvent to adjust the viscosity, and mixing in a ThinkyARV-310 planetary vacuum mixer to provide a mixed slurry;

(2) using Hohsen auto applicator, coating the mixed slurry on a PET release liner;

(3) drying the PET release liner at room temperature for 5 min. and then put it into a drying oven at a temperature of 70° C. for 30 min., resulting in a dry film with a thickness of 52 μm.

Test Procedure

The rheology performance is measured by TA ARES G2 rheometer using following conditions: (1) 15-125° C. by 20° C./min.; (2) 125° C. for 30 min.; and (3) 0.5% strain, 1.0 Hz frequency, and by using 8 mm steel plate.

3.2 Warm White Phosphor Film 4W Formulation:

The materials as used are as follows:

Silicone binder 4: Dow Corning® LF-1112 Phosphor Film Binder Part A+Part B (1:1), 5 g, commercially available from DOW CORNING CORPORATION;

Phosphor 1: YAG-04 Phosphor, commercially available from Intematix Corporation.

Phosphor 5: MPR-1003 Phosphor, commercially available from Mitsubishi Chemical Corporation.

In 4W formulation, the ratio of Silicone binder 4 to Phosphors 1 and 5 is 100:110. The ratio of Phosphor 1 to Phosphor 5 is 10:1.

Sample Preparation (1) providing 5 g Phosphor 1 and 0.5 g Phosphor 5 with 2.5 g part A of Silicone binder 4 and 2.5 g part B of Silicone binder 4, with adding 0.5 g propyl propionate as organic solvent to adjust the viscosity, and mixing in a ThinkyARV-310 planetary vacuum mixer to provide a mixed slurry;

(2) using Hohsen auto applicator, coating the mixed slurry on a PET release liner;

(3) drying the PET release liner at room temperature for 5 min. and then put it into a drying oven at a temperature of 70° C. for 30 min., resulting in a dry film with a thickness of 86 μm.

Test Procedure

The rheology performance is measured by TA ARES G2 rheometer using following conditions: (1) 15-125° C. by 20° C./min.; (2) 125° C. for 30 min.; and (3) 0.5% strain, 1.0 Hz frequency, and by using 8 mm steel plate.

Rheology Performance

Cold white and warm white phosphor films' rheology performances are listed in below table.

| Phosphor film | Gelling time (sec.) | Max. tan δ |
|---|---|---|
| 4C | 386 | 1.70 |
| 4W | 280 | 1.49 |

As shown in Example 3, in cased of a hydrosilylation curable composition, phosphor will not impact silicone binder system's Rheology performance, thereby curing performance. So it not necessary to adjust the mix ratio of silicone binder to phosphor.

Figure 4:
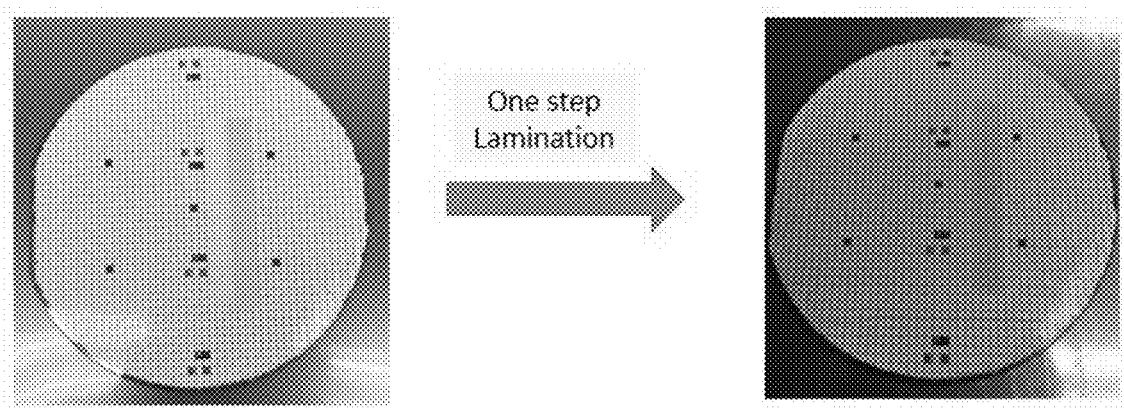
FIG. 4 is a schematic diagram showing an exemplary embodiment (Example 3) of the method for producing LED (e.g., dual color LED) in present invention.

Lamination:

Cold white and warm white phosphor films 4C and 4W are laminated by Fulin PLC-100A vacuum laminator. The lamination conditions are as follows:

Lamination temperature: 121.8° C.;
Lamination time: 300 seconds; and
Vacuum: 0.34 kPa As shown in FIG. 4, Cold white and warm white phosphor films 4C and 4W are successfully laminated on LEDs in one step film lamination, which exhibits uniform phosphor dispersion and better color quality.

The above descriptions are merely embodiments of the invention and are not intended to restrict the scope of the invention. All kinds of variations and modifications could be made to the present invention to those skilled in the art. Any modifications, alternatives and improvements made within the spirit and principles of the present invention shall fall within the scope of the appended claims.

What is claimed is:

1. A method for producing LEDs having two or more colors, comprising: curing two or more separate colored phosphor films laminated to each other and to each of two or more LEDs by one heating step;
    wherein each of the colored phosphor film comprises each other different colored phosphor composition which has a Maximum tan δ; and
    the difference of each Maximum tan δ varies within a range of 0-30% and
    wherein the colored phosphor composition comprises a silicone binder.

2. The method according to claim 1, wherein each of the different colored phosphor composition has a gelling time, and the difference of each gelling time varies within a range of 0-50%.

3. The method according to claim 1, wherein the difference of each Maximum tan δ varies within a range of 0-15%.

4. The method according to claim 1, wherein the colored phosphor composition further comprises a cure catalyst and a phosphor; and
    the difference of Maximum tan δ is controlled by adjusting a ratio of the catalyst and silicone binder, and/or a ratio of the silicone binder and phosphor.

5. The method according to claim 2, wherein the colored phosphor composition further comprises a cure catalyst and a phosphor; and
    the difference of gelling time and/or Maximum tan δ is controlled by adjusting a ratio of the catalyst and silicone binder, and/or a ratio of the silicone binder and phosphor.

6. The method according to claim 4, wherein the phosphor is pre-treated with a treatment agent.

7. The method according to claim 6, wherein the treatment agent is a basic compound.

8. The method according to claim 6, wherein the phosphor is pre-treated by the following method: (1) contacting the phosphor with treatment agent for a period time so as to ensure a good dispersion of phosphor in the treatment agent; and (2) drying the phosphor coated with the treatment agent, which is ready to be used with the silicone binder.

* * * * *

UNITED STATES PATENT AND TRADEMARK OFFICE
CERTIFICATE OF CORRECTION

| | | |
|---|---|---|
| PATENT NO. | : 11,923,483 B2 | Page 1 of 1 |
| APPLICATION NO. | : 17/055340 | |
| DATED | : March 5, 2024 | |
| INVENTOR(S) | : Anna Ya Ching Feng and Lu Zhou | |

It is certified that error appears in the above-identified patent and that said Letters Patent is hereby corrected as shown below:

On the Title Page

Item (73) reads:
RHOM AND HAAS ELECTRONIC MATERIALS, LLC, Wilmington, DE (US)

Should be:
RHOM AND HAAS ELECTRONIC MATERIALS, LLC, Marlborough, MA (US)

Signed and Sealed this
Eighteenth Day of June, 2024

Katherine Kelly Vidal
*Director of the United States Patent and Trademark Office*